(12) United States Patent
Lee et al.

(10) Patent No.: US 8,502,934 B2
(45) Date of Patent: Aug. 6, 2013

(54) LIGHT SOURCE UNIT, BACKLIGHT UNIT AND LIQUID CRYSTAL DISPLAY HAVING THE SAME

(75) Inventors: Young-Keun Lee, Chunan-si (KR); Si-Joon Song, Suwon-si (KR); Gi-Gherl Kim, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1011 days.

(21) Appl. No.: 12/266,375

(22) Filed: Nov. 6, 2008

(65) Prior Publication Data

US 2009/0174840 A1 Jul. 9, 2009

(30) Foreign Application Priority Data

Jan. 9, 2008 (KR) .................. 10-2008-0002581

(51) Int. Cl.
*G02F 1/1335* (2006.01)
*F21S 4/00* (2006.01)
*H01L 33/00* (2010.01)
*H01L 27/15* (2006.01)

(52) U.S. Cl.
USPC ............ 349/61; 349/68; 362/97.2; 362/97.3; 362/227; 362/249.01; 362/249.03; 362/555; 257/88; 257/99

(58) Field of Classification Search
USPC ................ 349/61–64, 67–68; 362/97.1–97.4, 362/227, 249.01–249.03, 367, 555; 257/88, 257/99, E33.056
See application file for complete search history.

(56) References Cited

U.S. PATENT DOCUMENTS

2006/0006406 A1* 1/2006 Kim et al. ...................... 257/100

* cited by examiner

*Primary Examiner* — Uyen Chau N Le
*Assistant Examiner* — Michael Mooney
(74) *Attorney, Agent, or Firm* — F. Chau & Associates, LLC

(57) ABSTRACT

A light source unit includes a substrate, a plurality of light emitting elements mounted on the substrate, a first inner wiring portion formed on the substrate and connected to the plurality of light emitting elements, and a second inner wiring portion formed on the substrate insulated from the first inner wiring portion. Two such light source units may be included in a backlight unit having a plurality of light emitting elements. A receiving member accommodates the first light source unit and the second light source unit, and a length of wires arranged along inside edges of the receiving member is reduced.

13 Claims, 8 Drawing Sheets

LIGHT SOURCE UNIT, BACKLIGHT UNIT AND LIQUID CRYSTAL DISPLAY HAVING THE SAME

CROSS-REFERENCE TO RELATED APPLICATIONS

This application claims priority under 35 U.S.C. 119 to Korean Patent application No. 10-2008-0002581, filed on Jan. 9, 2008, the contents of which are herein incorporated by reference in their entirety.

BACKGROUND OF THE INVENTION

1. Technical Field

The present invention relates to a liquid crystal display, and more particularly, to a light source unit, a backlight unit having the light source unit and a liquid crystal display having the backlight unit.

2. Discussion of the Related Art

Recently, flat panel displays such as liquid crystal displays (LCDs) and plasma display panels (PDPs) have been developed to replace cathode ray tubes (CRTs). However, the LCD is not self-luminescent, and a light source is required. Therefore, a backlight unit having a variety of light sources is provided in the rear of an LCD panel.

Generally, a point light source such as a light emitting diode (LED) or a linear light source such as an electroluminescent lamp (EL) or a cold cathode fluorescent lamp (CCFL) is used as the light source of the backlight unit.

Where a backlight unit with an LED light source is applied to a large-size LCD over 40 inches, the backlight may be formed by mounting a plurality of LEDs on a plurality of substrates using a surface mount technology (SMT) machine. In addition, a single LED driving board is mounted to one side of a lower receiving member of the backlight. However, because only one LED driving board is used, each LED is not driven independently.

Meanwhile, pads are installed respectively on one side of each LED substrate and are connected in one direction, for example, an abscissa direction, so that the LED substrates are connected to the LED driving board through the pads and wires. When the LED driving board is mounted, for example, to the left side of the lower receiving member, two LED substrates are installed in the abscissa direction, and four light source units are installed in a ordinate direction. The pads are installed on the left sides of the left-side LED substrates and on the right sides of the right-side LED substrates. However, since the pads are installed on the right sides of the right-side LED substrates, the wires are arranged along inside edges of the lower receiving member and connected to the LED driving board installed on the left side.

Accordingly, in order to keep the wires arranged along the inside edges of the lower receiving member contained, a double-sided tape or the like is often used to attach and fix the wires thereto. These techniques may require that the length of the wires used be increased, and doing so may increase production cost. Further, since the wires may have to be manually arranged, production costs may be increased, production time may be lengthened and a defect rate may be increased. Furthermore, the wires may be deformed due to a temperature rise of the lower receiving member, or an adhesion defect of the double-sided tape may occur, thereby causing a misoperation.

SUMMARY OF THE INVENTION

Exemplary embodiments of the present invention provide a light source unit, wherein pads are installed at one side of one of a plurality of light source units. Accordingly, production cost and a defect generation rate are minimized. A backlight unit and a liquid crystal display include the light source unit.

Exemplary embodiments of the present invention provide a backlight unit, wherein a light source unit having pads installed thereon and a light source unit having no pad installed are electrically connected to each other by a connector. A liquid crystal display includes the backlight unit.

Exemplary embodiments of the present invention provide a backlight unit, wherein a connector electrically connecting a light source unit having pads installed thereon and a light source unit having no pad installed is installed on a lower receiving member, and a liquid crystal display having the backlight unit.

According to an aspect of the present invention, there is provided a light source unit, which includes a substrate, a plurality of light emitting elements mounted on the substrate, a first inner wiring portion formed on the substrate and connected to the plurality of light emitting elements, a second inner wiring portion formed on the substrate to be insulated from the first inner wiring portion, a first pad installed on one side of the substrate and connected to the first inner wiring portion, a second pad installed on one side of the substrate and connected to the second inner wiring portion, and at least one connection electrode formed on a bottom surface of the substrate and connected to the second inner wiring portion.

The light source unit may further include at least one hole through the substrate and filled with a conductive material connecting the second inner wiring portion and the connection electrode to each other.

According to an aspect of the present invention, there is provided a backlight unit, which includes a first light source unit having first and second power supply units formed on a substrate and having first and second pads installed on one side of the substrate. The first power supply unit supplies power to a plurality of light emitting elements mounted on the one substrate. The second power supply unit is insulated from the first power supply unit. The first and second pads are respectively connected to the first and second power supply units. The backlight unit additionally includes a second light source unit having a plurality of light emitting elements mounted on another substrate, a receiving member accommodating the first light source unit and the second light source unit, and a connector electrically connecting the first light source unit and the second light source unit to each other.

The first light source unit may further include at least one connection electrode formed on a bottom surface of the one substrate, and the second inner wiring portion is connected to the connection electrode.

The second light source unit may further include a first inner wiring portion allowing the power supplied from the first light source unit to be supplied through the connector to the plurality of light emitting elements mounted on the other substrate.

The backlight unit may further include at least one second inner wiring portion for supplying power to the other adjacent light source unit through the connector.

The second light source unit may further include at least one connection electrode formed on at least one of the sides of a bottom surface of the other substrate. The first inner wiring portion is connected to the connection electrode formed on the one side, and the second inner wiring portion is connected to the connection electrode formed on the other side.

The connector may be fixed to the receiving member. The connector may include at least one insulator for insulating the light source units from the receiving member and at least one conductive pattern formed on the insulator.

The conductive pattern may electrically connect a connection electrode of the first light source unit to a connection electrode of the second light source unit, and electrically connect connection electrodes of adjacent two second light source units.

The connector may include a base plate made of an insulating material to insulate the light source units from the receiving member; at least one groove formed in the base plate; and an electrode connection portion made of a conductive material and formed in the groove.

The electrode connection portion may have elasticity. The electrode connection portion may electrically connect a connection electrode of the first light source unit to a connection electrode of the second light source unit, and electrically connect connection electrodes of adjacent two second light source units.

The connector may further include at least one fixing member protruding from one surface of the base plate and fastened to the first light source unit and the second light source unit. The fixing member may include a hook.

According to an aspect of the present invention, there is provided a liquid crystal display, which includes a backlight unit having a plurality of light source units electrically connected to each other by a connector. Each of the light source units includes a plurality of light emitting elements mounted on a substrate, a first inner wiring portion connected to the light emitting elements, and a second inner wiring portion insulated from the first inner wiring portion. Each of the light source units also includes a liquid crystal display panel supplied with light from the backlight unit to display an image.

The light source units may include a first light source unit having a pad installed on one side thereof to be supplied with power from the outside and the second light source unit electrically connected to the first light source unit by the connector and supplied with power from the first light source unit.

The liquid crystal display may further include a light emitting element driving unit installed at an outer lower portion of a receiving member.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS

Figure 1A:
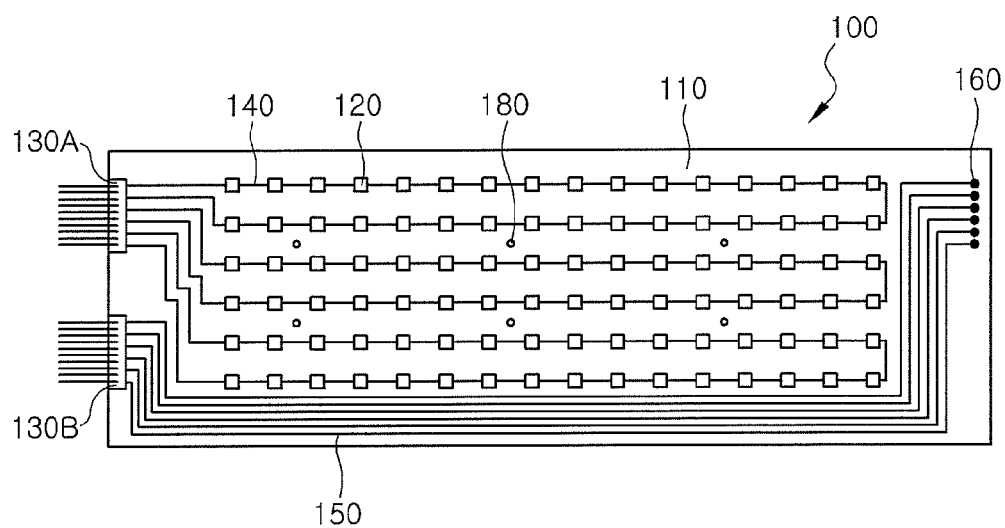
FIGS. 1A and 1B are a plan view and a bottom view illustrating a first light source unit according to an exemplary embodiment of the present invention.

Hereinafter, exemplary embodiments of the present invention will be described in detail with reference to the accompanying drawings. However, the present invention is not limited to the embodiments disclosed below but may be implemented into different forms. In the drawings, the thicknesses of layers and regions are exaggerated for clarity, and like reference numerals may be used to designate like elements throughout the specification and drawings. An expression that an element such as a layer, region, substrate or plate is placed on or above another element indicates not only a case where the element is placed directly on or just above the other element but also a case where a further element is interposed between the element and the other element.

Figure 1B:
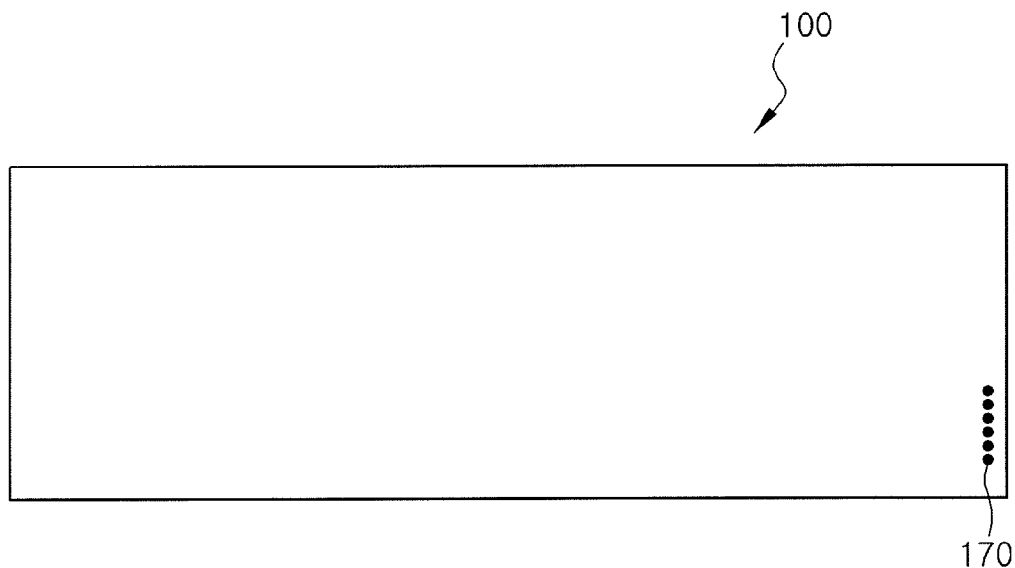
Figure 2A:
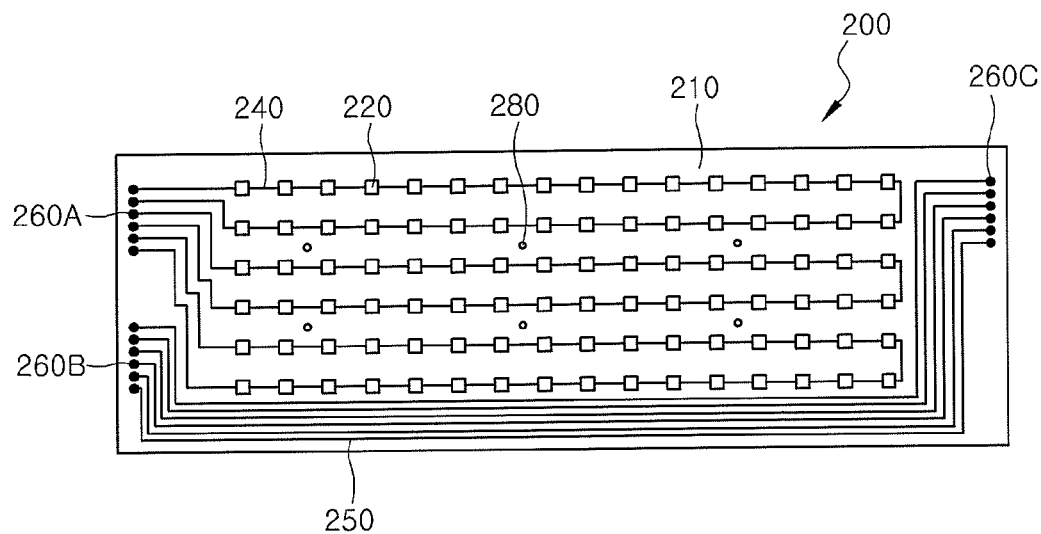
FIGS. 2A and 2B are a plan view and a bottom view illustrating a second light source unit according to an exemplary embodiment of the present invention.
Figure 2B:
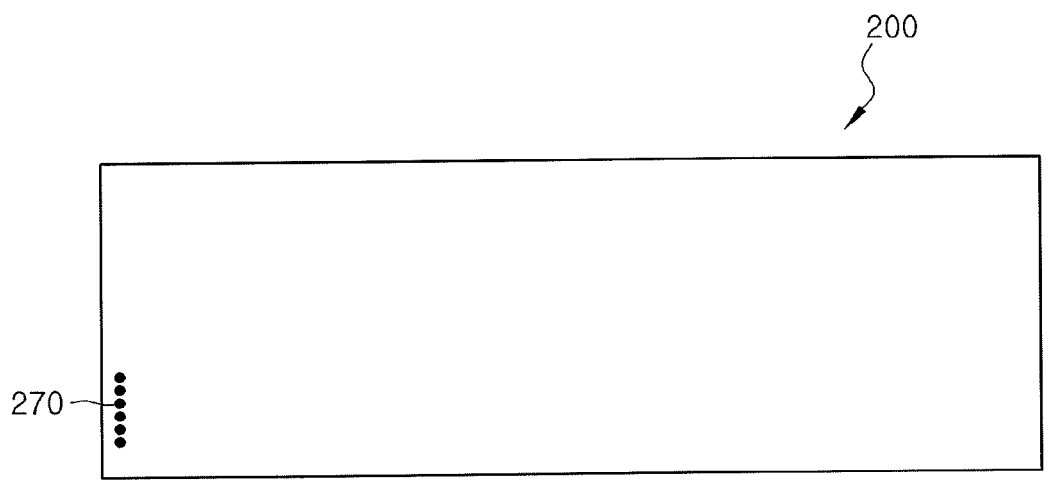
Figure 3:
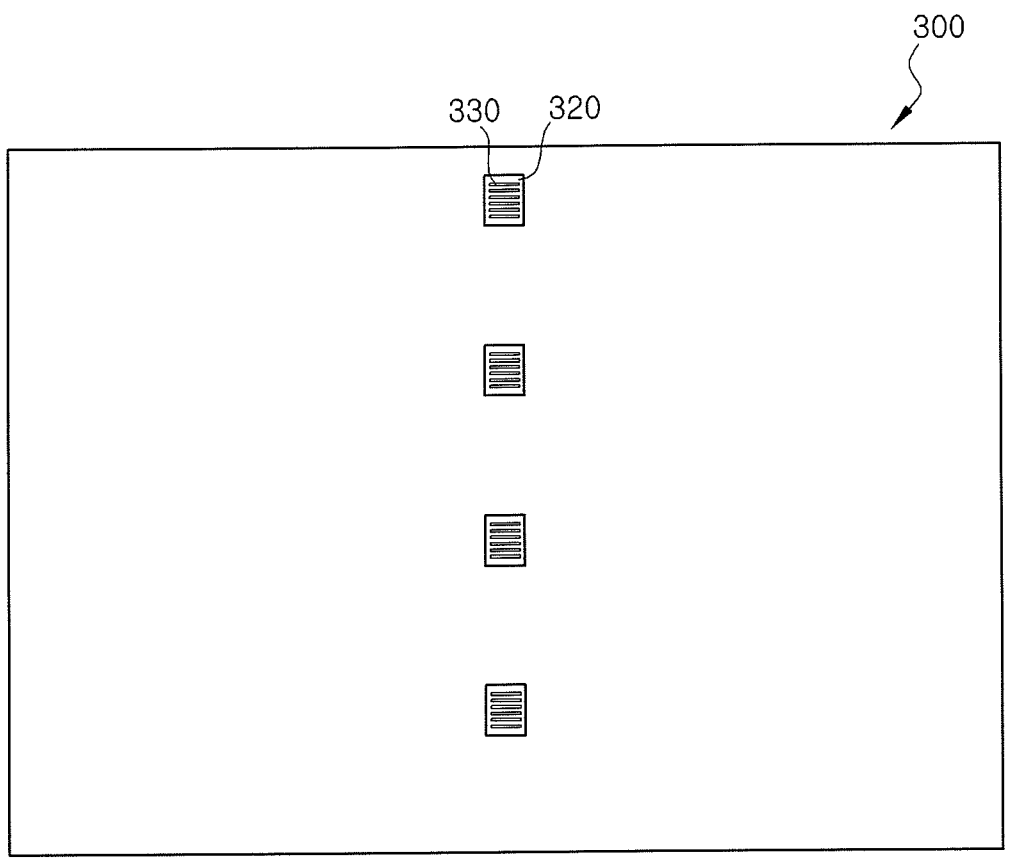
FIG. 3 is a schematic plan view illustrating a lower receiving member according to an exemplary embodiment of the present invention.
Figure 4:
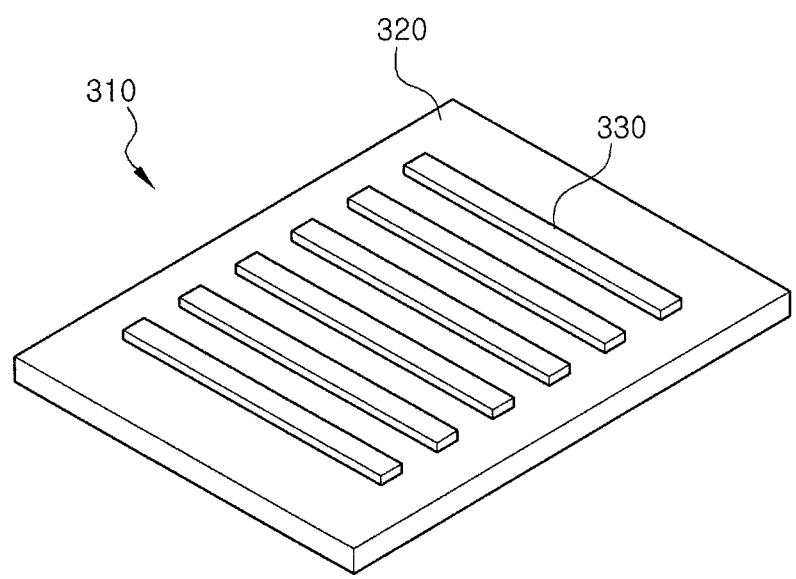
FIG. 4 is a perspective view illustrating a connector according to an exemplary embodiment of the present invention.
Figure 5:
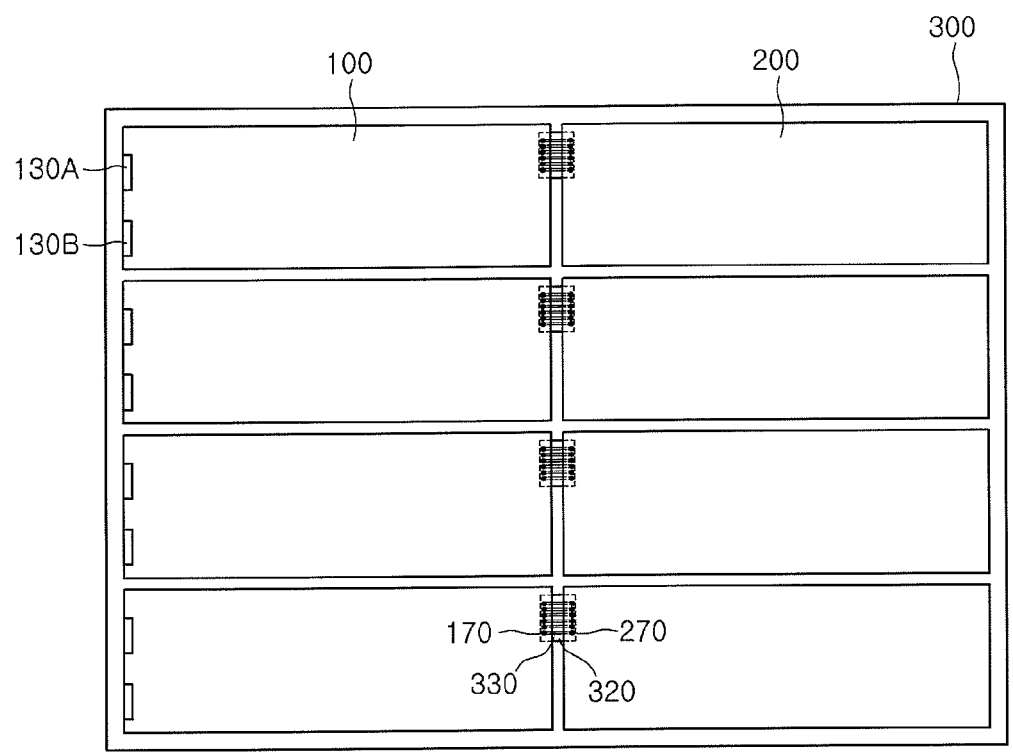
FIG. 5 is a schematic plan view illustrating a state where the lower receiving member and the first and second light source units are fastened to each other according to an exemplary embodiment of the present invention.
Figure 6:
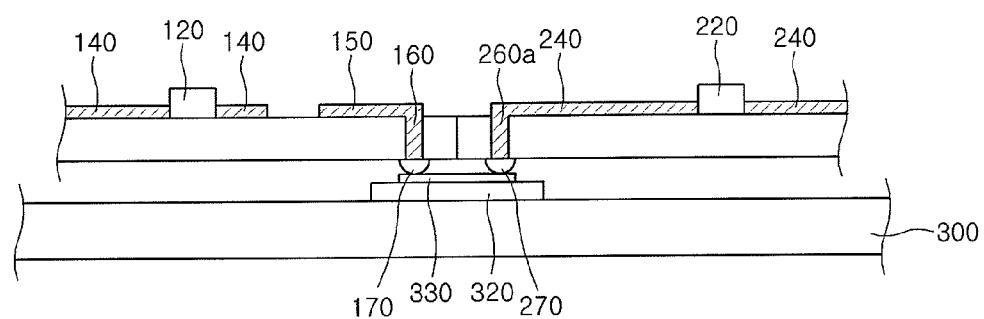
FIG. 6 is a schematic sectional view illustrating a state where the lower receiving member and the first and second light source units are fastened to each other according to an exemplary embodiment of the present invention.

FIGS. 1A and 1B are schematic plan views illustrating top and bottom surfaces of a first light source unit according to an exemplary embodiment of the present invention, and FIGS. 2A and 2B are schematic plan views illustrating top and bottom surfaces of a second light source unit according to an exemplary embodiment of the present invention. In addition, FIG. 3 is a schematic plan view illustrating a lower receiving member for fixedly accommodating the first and second light source units according to an exemplary embodiment of the present invention, and FIG. 4 is a schematic perspective view illustrating a connector for electrically connecting the first and second light source units according to an exemplary embodiment of the present invention. Moreover, FIG. 5 is a schematic plan view illustrating a case where the first and second light source units are fixed to the lower receiving member, and FIG. 6 is a schematic sectional view illustrating a case where the first and second light source units are electrically connected by the connector.

Referring to FIGS. 1A and 1B, a first light source unit 100 according to an exemplary embodiment of the present invention includes a first substrate 110, a plurality of light source elements, for example, LEDs 120 mounted on the first substrate 110, and one or more pads 130A and 130B installed on one side of the first substrate 110. In addition, the first light source unit 100 further includes first and second inner wiring portions 140 and 150 composed of driving wires and power transfer wires for supplying power applied from the outside through the pads 130A and 130B to the plurality of LEDs 120 and a second light source unit 200. Each of the first and second inner wiring portions 140 and 150 includes a plurality of wires. For example, the number of the wires may be determined according to the number of connections of the LEDs 120. Moreover, a plurality of holes 160, one for each wire of the second inner wiring portion 150, are formed in one side end of the second inner wiring portion 150 where the pads 130A and 130B are not installed. The holes 160 may be filled with a conductive material. The second inner wiring portion 150 extends to the bottom surface of the first substrate 110 through the holes 160. For example, a solder paste may be applied to the holes 160 on the bottom surface of the first substrate 110 to thereby form connection electrodes 170. Accordingly, the second inner wiring portion 150 on the top surface of the first substrate 110 is electrically connected to the connection electrodes 170 on the bottom surface of the first substrate 110 through the holes 160. A plurality of holes may be formed at the other side ends of the first and second inner wiring portions 140 and 150 in the side of the first substrate 110 where the pads 130A and 130B are installed. The plurality of formed holes can be used to install the pads 130A and 130B. The two inner wiring portions 140 and 150 are formed, and thus, two pads 130A and 130B are formed. However, the number of the inner wiring portions 140 and 150 and the pads 130A and 130B may be adjusted according to the number of the light source units to be connected.

Referring to FIGS. 2A and 2B, a second light source unit 200 includes a second substrate 210, a plurality of LEDs 220 mounted on the second substrate 210, and a first inner wiring portion 240 for supplying power supplied from the second inner wiring portion 150 of the first light source unit 100 to the plurality of LEDs 220. The first inner wiring portion 240 includes a plurality of wires. The number of wires may be determined according to the number of connections of the LEDs 220. In addition, the second light source unit 200 may further include a second inner wiring portion 250 formed in the same manner as the second inner wiring portion 150 of the first light source unit 100. The second inner wiring portion 250 also includes a plurality of wires. Moreover, the second light source unit 200 further includes holes 260A, 260B and 260C formed in one side end of the first inner wiring portion 240 and on two ends of the second inner wiring portion 250. The holes 260A, 260B and 260C may be filled with a conductive material. The first inner wiring portion 240 extends to the bottom surface of the second substrate 210 through the holes 260A. For example, a solder paste may be applied to the holes 260A on the bottom surface of the second substrate 210 to thereby form connection electrodes 270.

Since the first and second light source units 100 and 200 are connected in one direction, for example, an abscissa direction, power is not supplied to the second inner wiring portion 250 of the second light source unit 200. This is because the first light source unit 100 and the second light source unit 200 are manufactured in the same manner. Since the first and second light source units 100 and 200 are manufactured in the same manner, the plurality of holes may be formed in the one side ends of the first and second inner wiring portions 140 and 150 in the first light source unit 100 as in the second light source unit 200. Therefore, when the pads 130A and 130B are installed on the one side of the light source unit selected from a plurality of the light source units manufactured in the same manner, the light source unit can be used as the first light source unit 100. Further, the light source unit can be used as the second light source unit 200 when the pads 130A and 130B are not installed thereon.

The components of the first light source unit 100 and the second light source unit 200 will be described in more detail below.

The plurality of LEDs 120 and 220 are mounted on the first and second substrates 110 and 210, and the first inner wiring portions 140 and 240 and the second inner wiring portions 150 and 250 for applying power from the outside to the plurality of LEDs 120 and 220 are formed thereon, respectively. The first and second substrates 110 and 210 may be formed of printed circuit boards (PCBs), for example, PCBs having a multi-layered structure. If PCBs having a multi-layered structure are used, the first inner wiring portions 140 and 240 and the second inner wiring portions 150 and 250 may be formed inside of the multi-layered PCBs as well as on the multi-layered PCBs. Accordingly, in addition to the first inner wiring portions 140 and 240 and the second inner wiring portions 150 and 250, other inner wiring portions may be formed on or inside of the multi-layered PCBs.

The plurality of LEDs 120 or 220 are mounted on the substrate 110 or 210 in abscissa and ordinate directions to be spaced apart from each other at predetermined intervals. In addition, each of the LEDs 120 and 220 may include a light emitting chip having a compound semiconductor laminate with a p-n junction structure so as to emit light through recombination of minority carriers (electrons or holes), a base member for mounting the light emitting chip thereon, and a molding portion for encapsulating the light emitting chip. Moreover, the LEDs 120 and 220 emit white light. To this end, a phosphor may be contained in a molding portion of a blue LED to emit white light. Further, blue (B), green (G) and red (R) LEDs may also be mixed to emit white light. A selected certain number of the LEDs 120 or 220 may be connected in series as one unit. For example, the LEDs 120 or 220 arranged in an abscissa direction may be connected in series to the adjacent LEDs 120 or 220 arranged in an abscissa direction. In addition, the plurality of selected LEDs 120 or 220 may be connected in series or parallel in various manners.

The pads 130A and 130B connect external wires, through which external power is applied, to the first and second inner wiring portions 140 and 150, thereby supplying power to the LEDs 120 and 220 of the first and second light source units 100 and 200. The pads 130A and 130B are installed on one side of the first light source unit 100 so that the first and second inner wiring portions 140 and 150 and the external wires can be connected through the holes that may be formed in the one side ends of the first and second inner wiring portions 140 and 150.

The first inner wiring portion 140 or 240 includes the plurality of wires and supplies power to the plurality of LEDs 120 or 220. The plurality of LEDs 120 or 220 are selectively connected in series by the wires. For example, two LED rows of the LEDs 120 or 220 arranged in the abscissa direction are connected in series by two wires of the first inner wiring portions 140 or 240. One of the wires may be a wire for power supply, and the other wire may be a wire connected to a ground terminal. The number of the wires may be adjusted according to the number of connections of the LEDs 120 or 220. In addition, the wires may be composed of a plurality of power supply wires and one ground connection wire.

The second inner wiring portion 150 can supply power to the second light source unit 200 adjacent to the first light source unit 100, and the second inner wiring portion 250 can supply power to another second light source unit adjacent to the second light source unit 200. The second inner wiring portion 150 allows the external power applied through the pad 130B to be supplied to the second light source unit 200 through the first light source unit 100. The second inner wiring portion 150 of the first light source unit 100 is electrically connected to the first inner wiring portion 240 of the second light source unit 200. In addition, if two or more second light source units 200 are arranged adjacent to each other, the second inner wiring portion 250 allows the external power supplied through the first light source unit 100 to be supplied to another adjacent second light source unit 200. However, if there are two light source units, the second inner wiring portion 250 may be a dummy wiring through which power is not supplied. Here, the second inner wiring portions 150 or 250 include the plurality of wires spaced apart from each other at predetermined intervals. Moreover, the second inner wiring portions 150 and 250 may be formed on the first and second substrates 110 and 210, respectively. If the first or second substrate 110 or 210 has a multi-layered structure, the second inner wiring portion 150 or 250 may be formed inside of the substrate 110 or 210.

The holes 160 may be formed in one side end of the second inner wiring portion 150, and the holes 260A, 260B and 260C may be formed in one side end of the first inner wiring portion 240 and one and the other side ends of the second inner wiring portion 250. The holes 160, 260A, 260B and 260C may be formed along minor axes of the first and second substrates 110 and 210 and may be spaced apart from the ends of the minor axes. The holes 160, 260A, 260B and 260C are filled with a conductive material to electrically connect the first inner wiring portions 140 and 240 and the second inner wiring portions 150 and 250 formed on the top surfaces of the first and second substrates 110 and 210 to the bottom surfaces of the first and second substrates 110 and 210, respectively. In addition, where desired, only some of the holes 160, 260A, 260B and 260C may be filled with a conductive material, and these holes may be used as connection parts.

The connection electrodes 170 are formed on the bottom surface of the first substrate 110 corresponding to the holes 160 formed in the other side end of the second inner wiring portion 150 of the first light source unit 100. The connection electrodes 270 are formed on the bottom surface of the second substrate 210 corresponding to the holes 260A formed in one side end of the first inner wiring portion 240 of the second light source unit 200. The connection electrodes 170 and 270 may be formed of solder paste, specifically by a printing method, such as a silk screen printing method or a metal mask printing method, using a conductive material.

Fixing holes 180 and 280 are further formed in predetermined positions of the substrates 110 and 210, respectively. The fixing holes 180 and 280 are used to screw the first and second light source units 100 and 200 to a lower receiving member.

Since the first and second light source units 100 and 200 according to an exemplary embodiment of the present invention are maintained to be insulated from each other, the second inner wiring portion 150 of the first light source unit 100 and the first inner wiring portion 240 of the second light source unit 200 should be electrically connected to each other. This connection may be established in a variety of ways. A method using a lower receiving member for accommodating the first and second light source units 100 and 200 according to an exemplary embodiment of the present invention will be explained with reference to FIGS. 3, 4, 5 and 6 below.

Referring to FIGS. 3 and 4, a plurality of connectors 310 are arranged in an ordinate direction in the middle of a lower receiving member 300 according to an exemplary embodiment of the present invention and are spaced apart from each other at predetermined intervals. Each of the connectors 310 includes an insulator 320, and a plurality of conductive patterns 330 formed on the insulator 320 at predetermined intervals.

The lower receiving member 300 is formed in the shape of a rectangular hexahedral box with an open top face and has a receiving space with a predetermined depth defined therein. The lower receiving member 300 may include a bottom and sidewalls vertically extending from respective edges of the bottom. In addition, the plurality of connectors 310 are formed in the middle of an inside floor surface of the lower receiving member 300 and are spaced apart from each other, for example, in the ordinate direction. Each of the connectors 310 includes the insulator 320 for insulating the first and second light source unit 100 and 200 from the lower receiving member 300, and the one or more conductive patterns 330 formed on the insulator 320 to electrically connect the first and second light source units 100 and 200. Therefore, the first and second light source units 100 and 200 can be electrically connected to each other in the receiving space of the lower receiving member 300.

The insulators 320 are formed in the middle of the lower receiving member 300 and are spaced apart from each other at predetermined intervals in the ordinate direction. For example, each insulator 320 may be formed in a portion where the first and second light source units 100 and 200 are connected to each other. The insulators 320 may be formed by attaching an insulating material on the lower receiving member 300 by a double-sided tape, or applying an insulating material to the lower receiving member 300 by a silk screen printing method. Moreover, the insulators 320 may be formed in the middle of the lower receiving member 300 to continuously extend in the ordinate direction.

The conductive patterns 330 may be formed on every insulator 320 by applying a conductive material thereto by a silk screen printing method or a metal mask printing method. In addition, the conductive patterns 330 are formed in the portions where the second inner wiring portion 150 of the first light source unit 100 and the first inner wiring portion 240 of the second light source unit 200 are connected to each other. For example, the conductive patterns 330 are formed to electrically connect the connection electrodes 170 of the first light source unit 100 to the connection electrodes 270 of the second light source unit 200. The number of conductive patterns 330 is determined from the number of the wires comprising the first and second inner wiring portions 140, 150, 240 and 250 of the first and second light source units 100 and 200. Accordingly, the second inner wiring portion 150 of the first light source unit 100 and the first inner wiring portion 240 of the second light source unit 200 are electrically connected to each other through the conductive patterns 330.

Meanwhile, an LED driving board (not shown) may be provided on one side, for example, the left side of the outside of the lower receiving member in the ordinate direction. The LED driving board (not shown) is connected to the pads 130A and 130B of the first light source unit 100 through the external wires. The LED driving board (not shown) supplies external power to drive the plurality of LEDs 120 of the first light source unit 100. In addition, the LED driving board (not shown) can adjust and supply the external power, thereby controlling the luminance.

As shown in FIGS. 5 and 6, the connection electrodes 170 and 270 formed respectively on the bottom surfaces of the first and second substrates 110 and 210 of the first and second light source units 100 and 200 are positioned to be aligned on the conductive patterns 330 of the lower receiving member 300. The first and second light source units 100 and 200 are screwed to the lower receiving member 300 through the fixing holes 180 and 280. The first and second light source units 100 and 200 are electrically connected to each other and fixed to the lower receiving member 300. For example, the second inner wiring portion 150 of the first light source unit 100 with the pads 130A and 130B installed on one side thereof is electrically connected to the first inner wiring portion 240 of the second light source unit 200 through the holes 160 filled with a conductive material, the connection electrodes 170, the connector 310 formed on the lower receiving member 300, and the connection electrodes 270 and the holes 260A of the second light source unit 200, so that the external power is supplied to the second light source unit 200 through the first light source unit 100. Accordingly, since the external wires are not connected to the other side of the second light source unit 200, the length of the wires is reduced. In addition, since the wires are not affected by the temperature of the lower receiving member 300, a defect can be prevented.

According to an exemplary embodiment of the present invention, the plurality of pads 130A and 130B are installed on the first light source unit 100. There may be as many pads as there are light source units to be connected. There may also be as many inner wiring portions as there are light source units to be connected. However, the present invention is not limited thereto. It is also possible to install one pad on the first light source unit 100, and a plurality of selected LEDs of the second light source unit 200 as well as the first light source unit 100 may be connected in series. For example, the LEDs in the same row of the light source units connected to each other may be connected in series to each other.

In addition, the first light source unit 100 and the second light source unit 200 may be arranged and connected in the abscissa direction. However, the first light source unit 100 and the second light source unit 200 may be arranged in the ordinate direction. This configuration can be implemented by adjusting the arrangement of the LEDs 120 and 220 or the first inner wiring portions 140 and 240 and the second inner wiring portions 150 and 250 on the first and second substrates 110 and 210.

Figure 7:
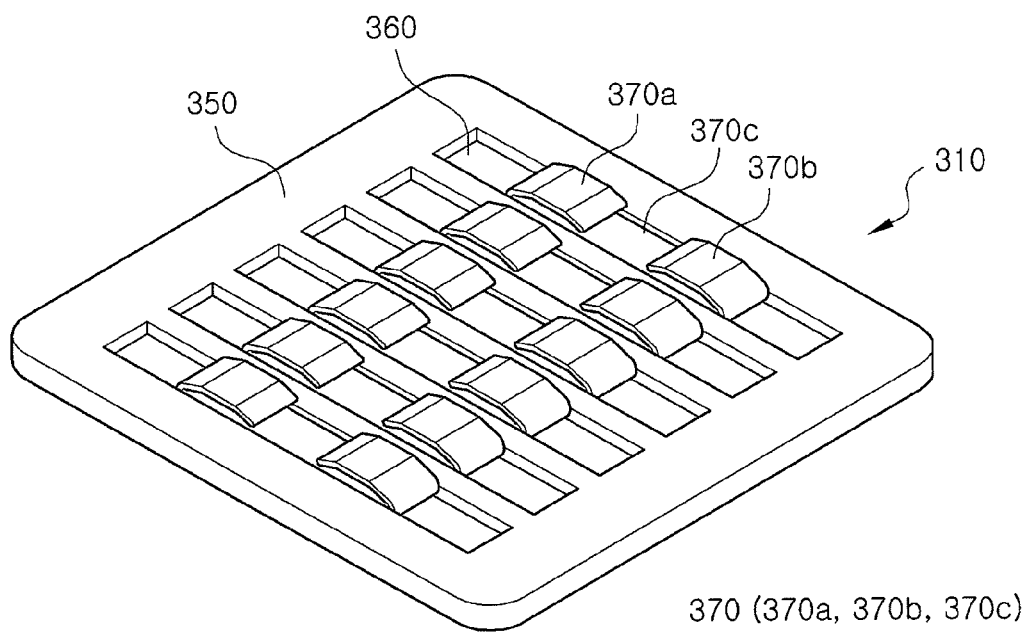
FIG. 7 is a perspective view illustrating a connector according to an exemplary embodiment of the present invention.
Figure 8:
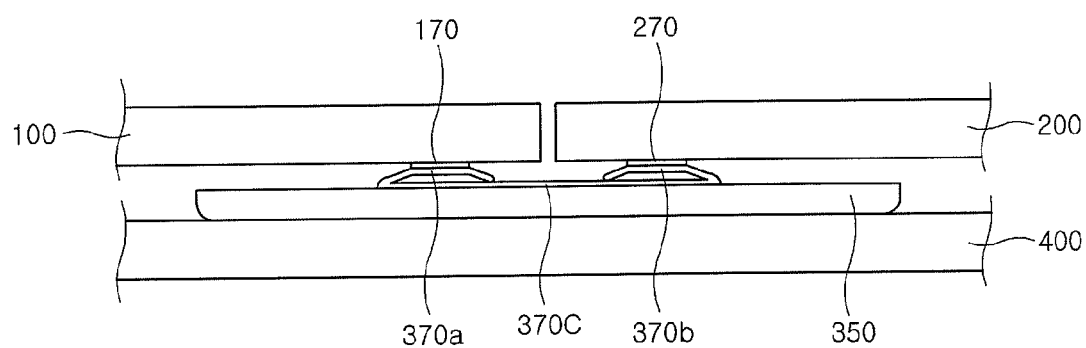
FIG. 8 is a schematic sectional view illustrating a state where a lower receiving member with the connector according to an exemplary embodiment of the present invention installed thereon and first and second light source units are fastened to each other.

FIG. 7 is a perspective view illustrating a connector installed on a lower receiving member according to an exemplary embodiment of the present invention, and FIG. 8 is a sectional view illustrating a state where the first and second light source units are electrically connected by the connector.

Referring to FIG. 7, connectors 310, as discussed above, are arranged in the middle of the lower receiving member in the ordinate direction to be spaced apart from each other at predetermined intervals (see FIG. 3). Each of the connectors 310 includes a base plate 350, a plurality of grooves 360 formed in the base plate 350, and a plurality of electrode connection portions 370 are respectively installed in the grooves 360.

The base plates 350 are installed in the middle of the inside floor surface of the lower receiving member 300 in the ordinate direction to be spaced apart from each other at predetermined intervals. The base plates 350 may be attached to the lower receiving member 300 through a double-sided tape or the like. The base plates 350 are made of, for example, an insulating material to electrically insulate the first and second light source units 100 and 200 from the lower receiving member 300.

There may be the same number of electrode connection portions 370 as connection electrodes 170 or 270 of the first or second light source unit 100 or 200 so as to electrically connect the connection electrodes 170 and 270. In addition, the electrode connection portions 370 may have elasticity to securely connect to the connection electrodes 170 and 270 of first and second substrates 110 and 210. For example, each electrode connection portion 370 is formed in such a shape that leaf springs 370a and 370b with both sides protruding are connected to a conductive plate 370c. The electrode connection portions 370 are brought into surface contact with the connection electrodes 170 and 270. However, the present invention is not limited thereto. The contact portions may be formed in the shape of a protrusion to enhance the contact force. The electrode connection portions 370 may be mounted in the grooves 360 formed in the base plate 350. The groove 360 is formed in the abscissa direction of the base plate 350 to have a predetermined depth and to be longer than the electrode connection portion 370. The electrode connection portions 370 may be mounted on the base plate 350 in various manners. For example, the electrode connection portions 370 may be attached to the base plate 350 without using the grooves 360.

As shown in FIG. 8, the connection electrodes 170 and 270 formed respectively on the bottom surfaces of the first and second substrates 110 and 210 of the first and second light source units 100 and 200 are positioned to be aligned with the electrode connection portions 370 of the lower receiving member 300. The first and second light source units 100 and 200 are screwed to the lower receiving member 300 through the fixing holes 180 and 280. Therefore, the first and second light source units 100 and 200 are electrically connected to each other and fixed to the lower receiving member 300.

Figure 9:
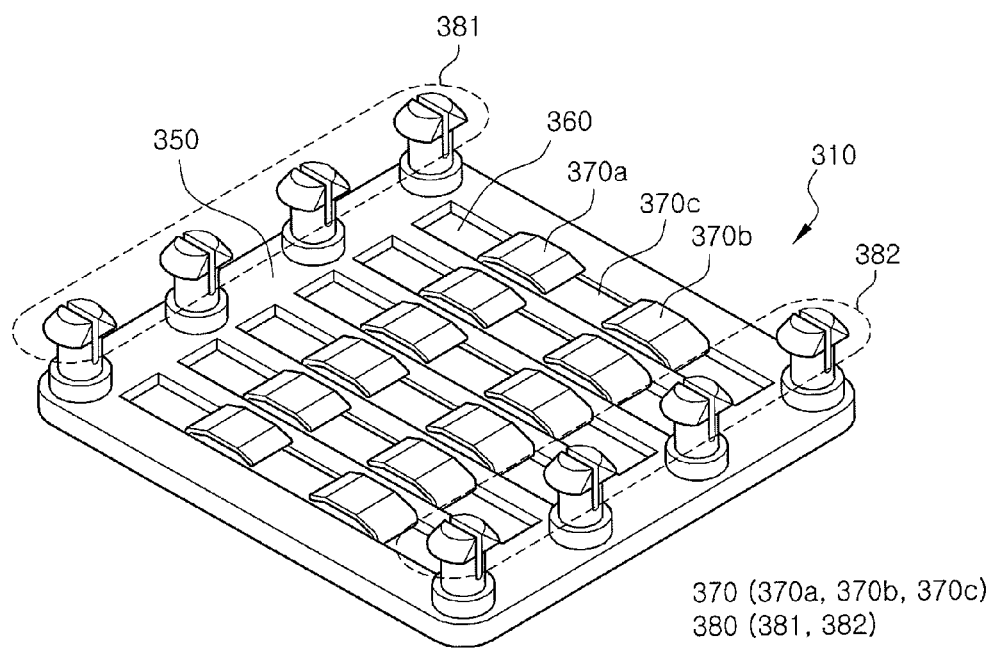
FIG. 9 is a perspective view illustrating a connector according to an exemplary embodiment of the present invention.
Figure 10:
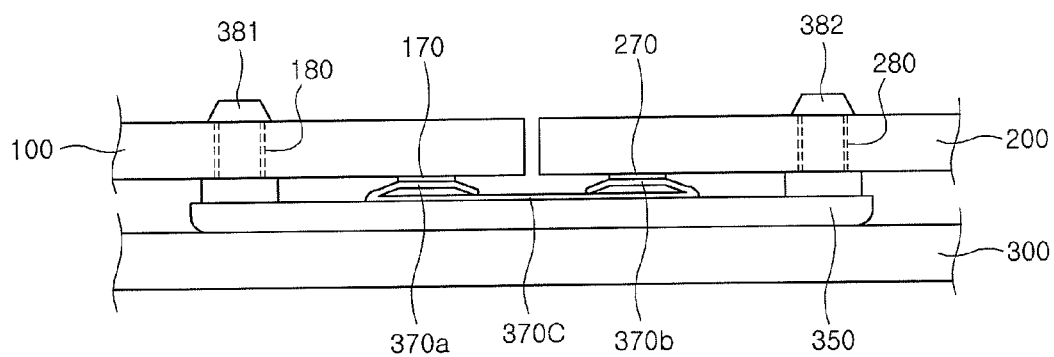
FIG. 10 is a schematic sectional view illustrating a state where a lower receiving member with the connector according to an exemplary embodiment of the present invention having first and second light source units fastened to each other.

FIG. 9 is a perspective view illustrating a connector according to an exemplary embodiment of the present invention, and FIG. 10 is a sectional view illustrating a state where the first and second light source units are electrically connected and fastened by the connector.

Referring to FIG. 9, a connector 310 includes a base plate 350, a plurality of grooves 360 formed in the base plate 350, a plurality of electrode connection portions 370 (370a, 370b, and 370c) installed in the grooves 360, and fixing members 380 (381 and 382) formed on both edge regions of the base plate 350.

The fixing members 380 are coupled to the fixing holes 180 and 280 formed in corresponding portions of the substrates 110 and 210 to fasten the connector 310 to the substrates 110 and 210. The fixing members 380 include the first fixing members 381 fastened to the first substrate 110 of the first light source unit 100, and the second fixing members 382 fastened to the second substrate 210 of the second light source unit 200. The fixing members 380 may, for example, include hooks.

In addition, the first fixing members 381 are fastened to the fixing holes 180 formed in corresponding portions of the first substrate 110. The second fixing members 382 are fastened to the fixing holes 280 formed in corresponding portions of the second substrate 210. Here, the fixing holes 180 and 280 formed in the first and second substrates 110 and 210, except the fixing holes 180 and 280 to which the fixing members 380 are fastened, can be used for screwing the first and second substrates 110 and 210 to the lower receiving member 300. There may be multiple fixing members 380 to increase the fastening force between the first and second substrates 110 and 210 and the connector 310.

Moreover, the fixing member 380 may have a stepped portion at a region connected to the base plate 350. Therefore, after the fixing members 380 are inserted into the fixing holes 180 and 280 of the first and second substrates 110 and 210, the introduction of foreign materials can be prevented. Here, a lower diameter of the fixing member 380 is larger than an upper diameter thereof due to the stepped portion. The lower diameter of the fixing member 380 may be larger than the diameter of the fixing hole 180 or 280 of the first or second substrate 110 or 210, and the upper diameter of the fixing member 380 may be equal to or smaller than the diameter of the fixing hole 180 or 280 of the first or second substrate 110 or 210.

As shown in FIG. 10, the connection electrodes 170 and 270 formed respectively on the bottom surfaces of the first and second substrates 110 and 210 of the first and second light source units 100 and 200 are positioned to be aligned with the electrode connection portions 370 of the lower receiving member 300. The fixing members 380 are fastened to some of the selected fixing holes 180 and 280, and the first and second light source units 100 and 200 are screwed to the lower receiving member 300 through the other fixing holes 180 and 280. The first and second light source units 100 and 200 are electrically connected and fixed to each other through the connector 310 and securely fixed to the lower receiving member 300.

Although the connectors 310 are attached to the lower receiving member 300 in the exemplary embodiment described above, the connectors 310 may be fastened to the lower receiving member 300 in various manners. For example, through holes may be formed in certain regions of the connectors 310, and grooves may be formed in certain regions of the lower receiving member 300, so that the connectors 310 may be screwed to the grooves of the lower receiving member 300 through the through holes.

Figure 11:
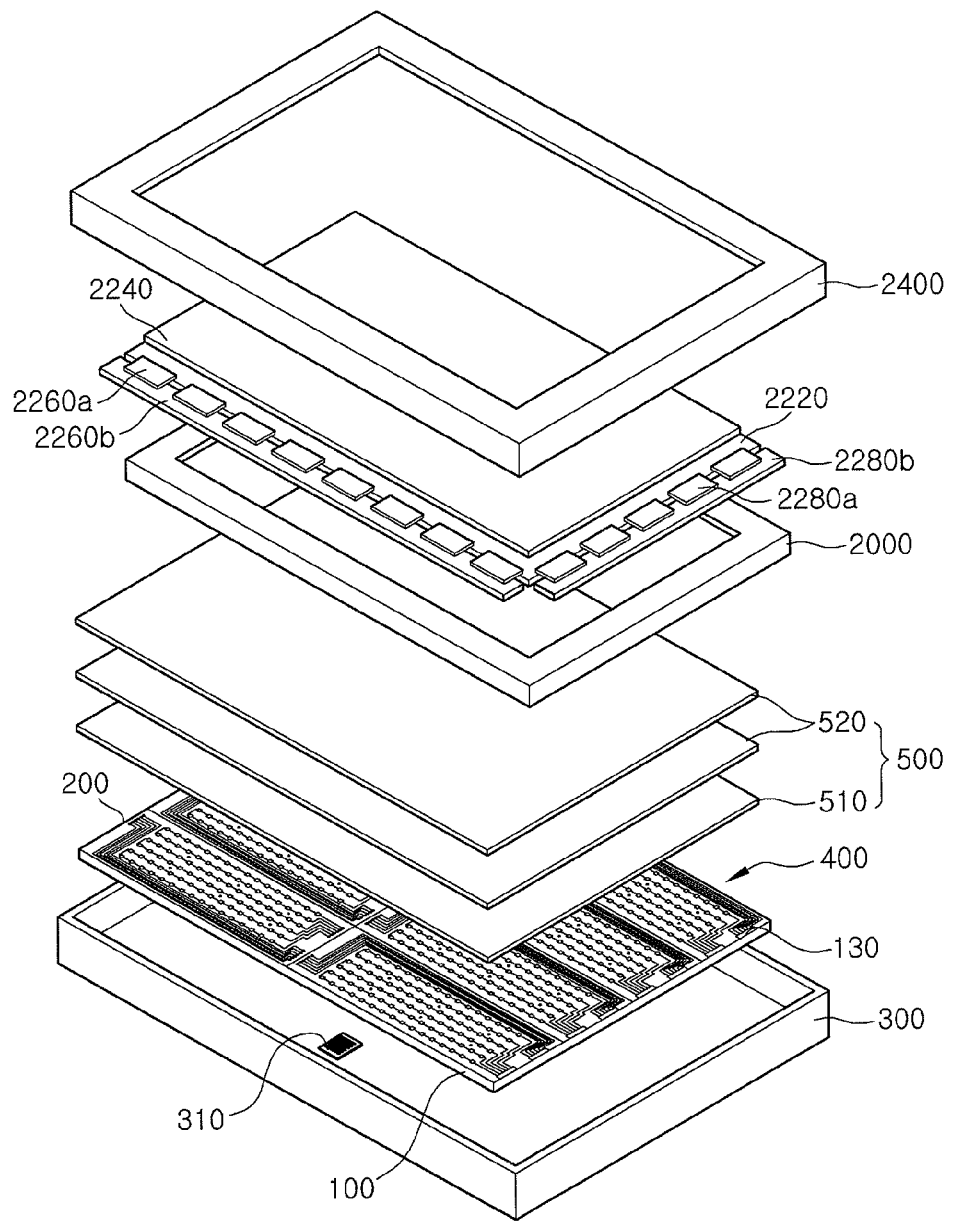
FIG. 11 is a schematic exploded perspective view illustrating a liquid crystal display having a backlight unit according to an exemplary embodiment of the present invention.

FIG. 11 is a schematic perspective view illustrating a liquid crystal display (LCD) according to an exemplary embodiment of the present invention. The LCD has a backlight unit. The first light source unit 100 has the pads installed thereon and the second light source unit 200 has no pad installed. The light source units 100 and 200 are electrically connected by the connectors 310 installed on the lower receiving member 300.

Referring to FIG. 11, the LCD includes an LCD panel 2200, a backlight unit 1000, a mold frame 2000 for accommodating the backlight unit 1000, and an upper receiving member 2400 for surrounding side portions and a predetermined region of an upper portion of the LCD panel 2200 and the backlight unit 1000.

The LCD panel 2200 includes a thin film transistor (TFT) substrate 2220, data-side and gate-side tape carrier packages (TCPs) 2260a and 2280a connected to the TFT substrate 2220, data-side and gate-side PCBs 2260b and 2280b connected respectively to the data-side and gate-side TCPs 2260a and 2280a, a color filter substrate 2240 corresponding to the TFT substrate 2220, and a liquid crystal layer (not shown) injected between the TFT substrate 2220 and the color filter substrate 2240. Moreover, the LCD panel 2200 may further include multiple corresponding polarization plates (not shown) formed on top of the color filter substrate 2240 and on the bottom of the TFT substrate 2220.

Here, the TFT substrate 2220 is a transparent glass substrate on which TFTs and pixel electrodes are arranged in a matrix form. Data lines are connected to source terminals of the TFTs, and gate lines are connected to gate terminals thereof. In addition, pixel electrodes, which are transparent electrodes made of a transparent conductive material, are connected to drain terminals of the TFTs. When electrical signals are input into the data lines and the gate lines, the respective TFTs are turned on or off, whereby the electrical signals required for formation of pixels are applied to the drain terminals.

The color filter substrate 2240 is a substrate having R, G and B pixels, which are color pixels expressing predetermined colors when light passes therethrough, formed by a thin film forming process. A common electrode (not shown), which is a transparent conductive thin film made of a transparent conductor such as indium tin oxide (ITO) or indium zinc oxide (IZO), is formed over the entire surface of the color filter substrate 2240.

The backlight unit 1000 includes a light source unit assembly 400 having a plurality of the first light source units 100 with a plurality of LEDs mounted thereon and pads 130 installed on one side thereof and a plurality of the second light source units 200 on which no pad is installed. An optical sheet 500 is provided over the light source unit assembly 400 to increase the quality and efficiency of light emitted from the light source unit assembly 400. A lower receiving member 300 electrically connects the first and second light source units 100 and 200 to each other and accommodates the light source unit assembly 400 and the optical sheet 500. In addition, the backlight unit 1000 may further include an LED driving board (not shown) for driving the light source unit assembly 400.

The light source unit assembly 400 includes the plurality of first light source units 100 on each of which the one or more pads 130 are installed, and the plurality of second light source units 200 on which no pad is installed. Multiple first light source units 100 are arranged in a minor axis direction thereof. The one or more pads 130 are installed on one minor axis surface of each first light source unit 100. The second light source units 200 are arranged so that their one minor axis surfaces can be brought into contact with the other minor axis surfaces of the first light source units 100 where the pads 130 are not installed.

The lower receiving member 300 is formed in the shape of a rectangular hexahedral box with an open top face and has the receiving space with a predetermined depth defined therein. The lower receiving member 300 includes the bottom and the sidewalls vertically extending from the respective edges of the bottom. The connectors 310 for insulating the first and second light source units 100 and 200 from the lower receiving member 300 and electrically connecting the first and second light source units 100 and 200 to each other are installed on the inside floor surface of the lower receiving member 300. Accordingly, the first and second light source units 100 and 200 can be electrically connected to each other and fixedly accommodated in the receiving space of the lower receiving member 300, and the optical sheet 500 can be accommodated therein.

The optical sheet 500 may include a diffusion sheet 510 and prism sheets 520 to improve the quality and efficiency of light emitted from the light source unit assembly 400. The diffusion sheet 510 is positioned over the light source unit assembly 400, uniformly diffuses light emitted from a plurality of LEDs, and transfers the light in a front surface direction of the prism sheet 520 and the LCD panel 2200, thereby widening a viewing angle and reducing diffusion of bright defects, bright lines, spots and the like. The diffusion sheet 510 may be made of polycarbonate (PC) or polyester resin. The prism sheets 520 increase the luminance by refracting and condensing light exiting from the diffusion sheet 510, and then causes the light to be incident on the LCD panel 2200. The two prism sheets 520, each of which is formed by forming a band-shape micro-prism on a base material such as polyester, are used as a set.

The mold frame 2000 is formed in the shape of a quadrangular frame and includes a plane portion and a sidewall portion bent from the plane portion at a right angle. A seating portion may be formed on the plane portion so that the LCD panel 2200 can be seated thereon. The seating portion may include fixing protrusions for aligning and positioning the LCD panel 2200 by contacting an edge side surfaces thereof, or predetermined stepped projection surfaces. The mold frame 2000 positions and fixes the optical sheet 500 and the plurality of light source units 100 and 200 in the lower receiving member 300.

The upper receiving member 2400 is formed in the shape of a quadrangular frame and includes a plane portion and a sidewall portion bent from the plane portion at a right angle. The plane portion of the upper receiving member 2400 supports a region of the edges of the LCD panel 2200 on the lower side thereof, and the sidewall portion faces and is coupled to the sidewalls of the lower receiving member 300. The upper receiving member 2400 and the lower receiving member 300 may be made of a metal of excellent strength, light weight and less deformation.

According to exemplary embodiments of the present invention, a light source unit is formed by mounting a plurality of LEDs on a substrate and then forming driving wires for driving the LEDs and power transfer wires for transferring power thereto on the substrate to be insulated from each other. The light source units are installed and connected in two directions. Pads are installed on one side of the first light source unit installed in one direction adjacent to an LED driving board, and no pad is installed on the second light source unit connected to the first light source unit in the other direction. In addition, the first light source unit and the second light source unit are electrically connected to each other, for example, by a connector installed on a lower receiving member so that the second light source unit can be driven by the power supplied through the first light source unit.

Therefore, no pad is installed on the second light source unit farther from the LED driving board, thereby reducing a length of wires arranged along inside edges of the lower receiving member. Accordingly, manufacturing cost can be reduced and a defect generation rate can be suppressed. Moreover, the wires are not deformed even as the temperature of the lower receiving member rises, so that defects can be reduced or prevented. Further, an assembling time can be shortened, assembly automation can be achieved, and thus the productivity can be improved.

Although exemplary embodiments of the present invention have been illustrated and described in connection with the accompanying drawings, it will be understood by those skilled in the art that various modifications and changes can be made thereto without departing from the technical spirit of the invention.

What is claimed is:

1. A light source unit, comprising:
   a first substrate having a top surface and a bottom surface opposite to the top surface;
   a first plurality of light emitting elements mounted on the top surface of the first substrate;
   a first inner wiring portion, for carrying power to the first plurality of light emitting elements, formed on the top surface of the first substrate and connected to the first plurality of light emitting elements;
   a second inner wiring portion formed on the top surface of the first substrate, for carrying power to a second plurality of light emitting elements mounted on a top surface of a second substrate without driving any light emitting elements on the first substrate, and insulated from the first inner wiring portion;
   a first pad installed on the top surface of the first substrate and connected to the first inner wiring portion;
   a second pad installed on the top surface of the first substrate and connected to the second inner wiring portion; and
   at least one connection electrode formed on the bottom surface of the first substrate and connected to the second inner wiring portion,
   wherein the at least one connection electrode is connected to a corresponding at least one connection electrode formed on a bottom surface of the second substrate that is connected to the second plurality of light emitting elements of the second substrate.

2. The light source unit as claimed in claim 1, further comprising at least one hole through the first substrate, wherein the hole is filled with a conductive material to connect the second inner wiring portion and the connection electrode to each other.

3. The light source unit as claimed in claim 1, wherein the first plurality of light emitting elements include one or more LEDs.

4. A backlight unit, comprising:
   a first light source unit having first and second power supply units formed on a top surface of a first substrate and having first and second pads installed on a first side of the top surface of the first substrate, the first power supply unit supplying power to a plurality of light emitting elements mounted on the top surface of the first substrate, the second power supply unit insulated from the first power supply unit, the first and second pads respectively connected to the first and second power supply units;
   a second light source unit having a plurality of light emitting elements mounted on a top surface of a second substrate;
   a receiving member accommodating the first light source unit and the second light source unit; and
   a connector electrically connecting the first light source unit and the second light source unit to each other, the connector being formed on a bottom surface of the first and second substrates,
   wherein the first power supply unit supplied power to the plurality of light emitting elements mounted on the top surface of a second substrate, without supplying power to any light emitting elements on the first substrate, via the receiving member and the connector.

5. The backlight unit as claimed in claim 4, wherein the first light source unit further comprises at least one connection electrode formed on the bottom surface of the first substrate, and a second inner wiring portion connected to the connection electrode.

6. The backlight unit as claimed in claim 4, wherein the second light source unit further comprises a first inner wiring portion supplying power from the first light source unit through the connector to the plurality of light emitting elements mounted on the second substrate.

7. The backlight unit as claimed in claim 6, further comprising at least one second inner wiring portion for supplying power to the adjacent second light source unit through the connector.

8. The backlight unit as claimed in claim 7, wherein the second light source unit further comprises at least one connection electrode formed on at least one of a first side and a second side of the bottom surface of the second substrate, the first inner wiring portion connected to the connection electrode formed on the first side of the bottom surface of the second substrate, and the second inner wiring portion connected to the connection electrode formed on the second side of the bottom surface of the second substrate.

9. The backlight unit as claimed in claim 4, wherein the connector is fixed to the receiving member.

10. The backlight unit as claimed in claim 9, wherein the connector comprises:
    at least one insulator insulating the first and second light source units from the receiving member; and
    at least one conductive pattern formed on the insulator.

11. The backlight unit as claimed in claim 10, wherein the conductive pattern electrically connects a connection electrode of the first light source unit to a connection electrode of the second light source unit, and electrically connects connection electrodes of two adjacent second light source units.

12. The light source unit of claim 1, wherein all wiring to the second plurality of light emitting elements mounted on the top surface of the second substrate is provided via the first substrate.

13. The backlight unit of claim 4, wherein all wiring to the plurality of light emitting elements mounted on the top surface of the second substrate is provided via the first substrate.

* * * * *